ated under 35
(12) United States Patent
Wood et al.

(10) Patent No.: US 7,355,447 B2
(45) Date of Patent: Apr. 8, 2008

(54) LEVEL SHIFTER CIRCUIT

(75) Inventors: Neil E. Wood, Centreville, VA (US); Chan Lee, Fairfax, VA (US); Abbas Kazemzadeh, Herndon, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 47 days.

(21) Appl. No.: 11/445,699

(22) Filed: Jun. 2, 2006

(65) Prior Publication Data

US 2007/0279092 A1 Dec. 6, 2007

(51) Int. Cl.
*H03K 19/0175* (2006.01)
(52) U.S. Cl. .......................... 326/81; 326/86; 326/87; 326/68
(58) Field of Classification Search .............. 326/63, 326/68, 80–83, 86–87
See application file for complete search history.

(56) References Cited

U.S. PATENT DOCUMENTS

| 4,498,021 | A | * | 2/1985 | Uya | 326/86 |
| 4,656,373 | A | * | 4/1987 | Plus | 326/81 |
| 6,842,046 | B2 | * | 1/2005 | Tzartzanis et al. | 326/98 |
| 7,218,151 | B1 | * | 5/2007 | Kursun et al. | 326/95 |
| 2004/0041594 | A1 | * | 3/2004 | Kang et al. | 326/121 |
| 2004/0061524 | A1 | * | 4/2004 | Kumar et al. | 326/81 |

* cited by examiner

*Primary Examiner*—Rexford Barnie
*Assistant Examiner*—Jason Crawford
(74) *Attorney, Agent, or Firm*—Dillon & Yudell LLP; Anthony P. Ng

(57) ABSTRACT

A level shifter is disclosed. The level shifter includes a level shifter core circuit and a pull-up control logic circuit. In response to an input signal and an output signal of the level shifter core circuit, the pull-up control logic circuit selectively turns on a transistor within the level shifter core circuit to prevent the occurrence of a strong P-N fight state within the level shifter.

9 Claims, 2 Drawing Sheets

LEVEL SHIFTER CIRCUIT

BACKGROUND OF THE INVENTION

1. Technical Field

The present invention relates to integrated circuits in general, and in particular to complementary metal-oxide semiconductor (CMOS) integrated circuits. Still more particularly, the present invention relates to a CMOS level shifter circuit.

2. Description of Related Art

Quite often, integrated circuit (IC) devices manufactured under the current technology have to interface with IC devices manufactured under previous technologies. However, the CMOS voltage levels in IC devices from the current technology are usually different from the CMOS voltage levels in IC devices from previous technologies.

For example, the CMOS voltage levels in IC devices from the current technology typically range from 0 V to 1.2 V, and the CMOS voltage levels in IC devices from previous technologies typically range from 0 V to 3.3 V. Thus, in order to ensure proper interfacing between different CMOS voltage levels, IC devices manufactured under the current technology must include output buffer circuits that are capable of driving voltages greater than the core voltage.

Generally speaking, an output buffer circuit employs a level shifter circuit that is coupled to a power supply having a voltage different from the source voltage. In response to the values of the input signals, the level shifter circuit uses a set of output drivers to provide proper output voltages accordingly. For example, an output buffer circuit that receives input signals ranging from 0 V to 1.2 V output should be able to output signals ranging from 0 V to 3.3 V.

The present disclosure describes a level shifter circuit having improved characteristics in low-to-high voltage transition operations.

SUMMARY OF THE INVENTION

In accordance with a preferred embodiment of the present invention, a level shifter includes a level shifter core circuit and a pull-up control logic circuit. In response to an input signal and an output signal of the level shifter core circuit, the pull-up control logic circuit selectively turns on a transistor within the level shifter core circuit to prevent the occurrence of a strong P-N fight state within the level shifter.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
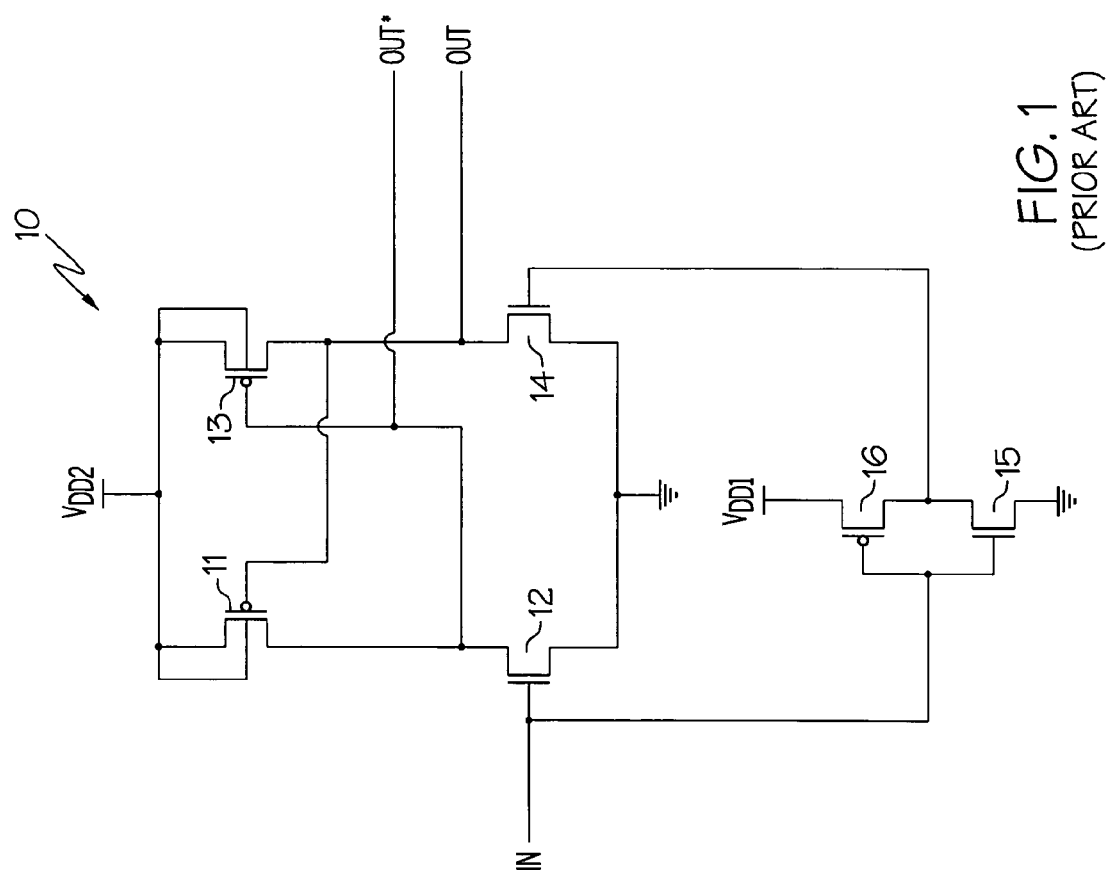
FIG. 1 is a schematic diagram of a level shifter circuit, according to the prior art.

Referring now to the drawings and in particular to FIG. 1, there is illustrated a schematic diagram of a level shifter circuit, according to the prior art. As shown, a level shifter circuit 10 includes p-channel transistors 11, 13 and 16. Level shifter circuit 10 also includes n-channel transistors 12, 14 and 15.

Transistors 15-16 are connected in series between a first power supply $V_{DD1}$ and ground in an invertor configuration having its input connected to the gate of transistor 12, and its output connected to the gate of transistor 14. The gate of transistor 12 also serves as an input IN to level shifter 10. The node between transistors 13 and 14 serves as an output OUT for level shifter 10, with the node between transistors 11 and 12 serves as the complementary output OUT*.

Transistors 11-12 are connected in series between a second power supply $V_{DD2}$ and ground. Similarly, transistors 13-14 are connected in series between the second power supply $V_{DD2}$ and ground. For the present configuration, transistor pair 11-12 and transistor pair 13-14 are cross-coupled to each other. Specifically, the gate of transistor 11 is connected to a node between transistors 13 and 14, and the gate of transistor 13 is connected to a node between transistors 11 and 12.

The problem with level shifter 10 is that it is not capable of meeting core voltage requirements for input voltages of less than 1 V. Specifically, the low gate voltage of transistor 12 causes weak saturation drain current and cannot overcome transistor 11 under a wide range of operating conditions.

Figure 2:
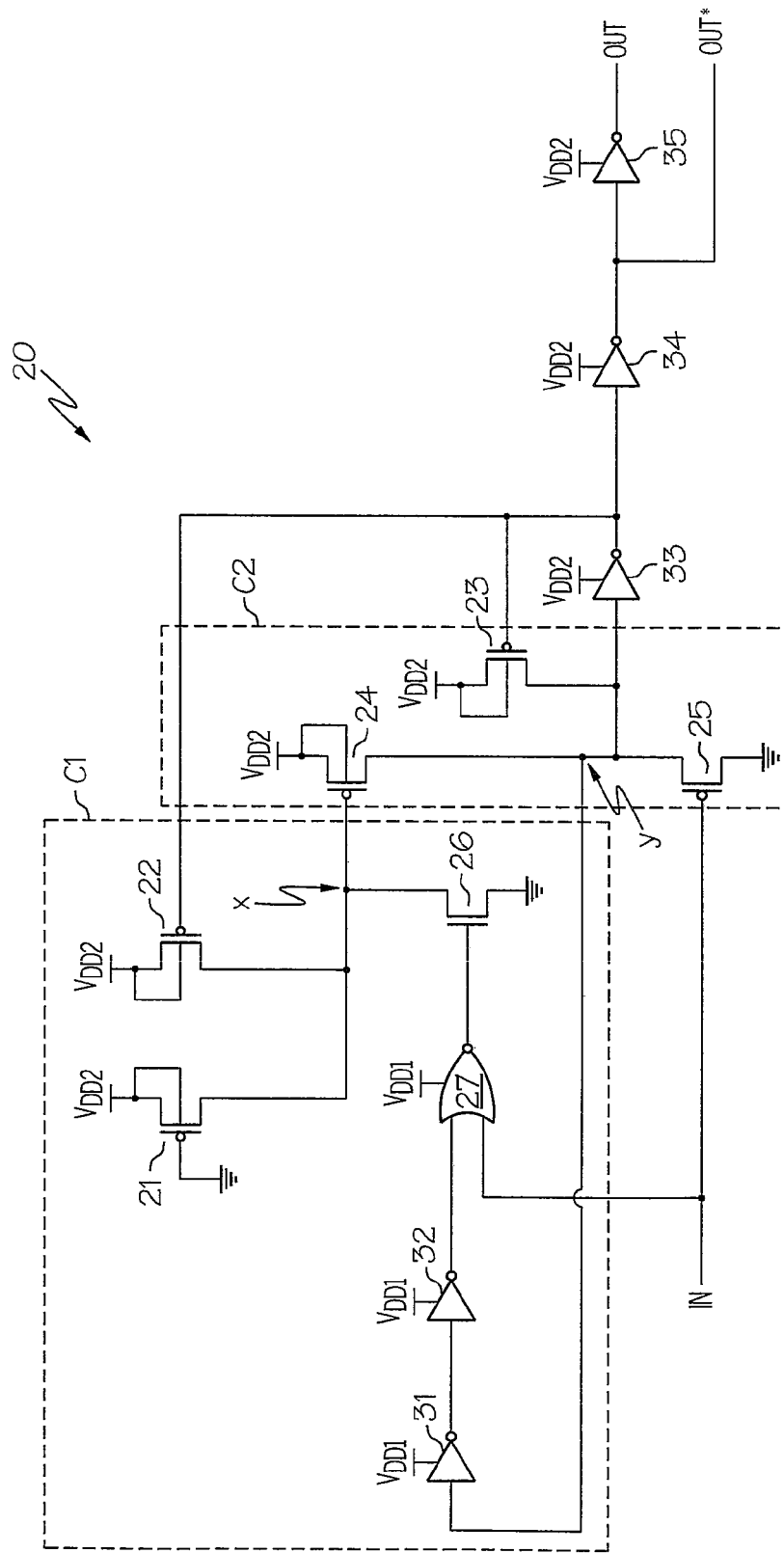
FIG. 2 is a schematic diagram of a level shifter circuit, in accordance with a preferred embodiment of the present invention.

With reference now to FIG. 2, there is illustrated a schematic diagram of a level shifter circuit, in accordance with a preferred embodiment of the present invention. As shown, a level shifter circuit 20 includes p-channel transistors 21-24, n-channel transistors 25-26, an two-input NOR gate 27, and inverters 31-35. Transistors 21-22, 26, NOR gate 27, and inverters 31-32 constitute a pull-up control logic block. Specifically, inverters 31-32 and NOR gate 27 are powered by a first power supply $V_{DD1}$ that provides a voltage lower than that of a second power supply $V_{DD2}$. Transistors 21-22 are connected in parallel between the second power supply $V_{DD2}$ and the drain of transistor 26. The gate of transistor 26 is connected to the output of NOR gate 27, and the source of transistor 26 is connected to ground. The body of transistors 21-22 are also connected to the second power supply $V_{DD2}$. One input of NOR gate 27 serves as an input IN to level shifter 20, and the other input of NOR gate 27 is connected to a node between transistors 24-25 via inverters 31-32.

The core of level shifter circuit 20 is formed by transistors 23-25. Transistors 24-25 are connected in series between the second power supply $V_{DD2}$ and ground. Inverters 33-35 are powered by the second power supply $V_{DD2}$. A node y between transistors 24-25 provides an output for level shifter circuit 20 via inverters 33-35 at an output OUT. A complementary output OUT* can be extracted from the node between inverters 34 and 35.

Transistor 23, which is powered by the second power supply $V_{DD2}$, serves as a keeper device for transistors 24-25, and inverter 33 provides timing control for level shifter circuit 20. The gate of transistor 23 is connected to the gate of transistor 22 and the output of inverter 33. The source of transistor 23 is connected to the input of inverter 33 and the node between transistors 24-25. The body of transistors 23-24 are also connected to the second power supply $V_{DD2}$.

During operation, the pull-up control logic block (i.e., transistors 21-22 and 26, NOR gate 27, and inverters 31-32) detects an input signal at input IN and node y, and outputs a control signal to a node x for turning transistor 24 either on or off. In addition, pull-up transistors 21-22 within the pull-up control logic block allows level shifter circuit 20 to be set in a deterministic state during power-up by turning off transistor 24 to remove any floating node condition at node x. In addition, transistor 23 prevents node y from floating. Inventor 33 helps to balance propagation delays within level shifter circuit 20, and provides feedback for transistor 23.

The effects of the control signal generated by the pull-up control logic block on transistors 23-25 within the core of level shifter circuit 20 can be summarized by a state table I.

STATE TABLE I

| IN | node y | transistor 23 | transistor 24 | transistor 25 |
|---|---|---|---|---|
| 0 | 0 | off | on | off |
| 0 | 1 | on | off | off |
| 1 | 0 | off | off | on |
| 1 | 1 | on | off | on |

According to state table I, when the input signal at input IN is a logical "0" and the control signal at node y is at a logical "1," then transistor 23 is turned on while both transistors 24-25 are turned off. When the input signal at input IN is at a logical "1," and the control signal at node y is at a logical "0," then transistor 25 is turned on while both transistors 23-24 are turned off. The above-mentioned two states represent the normal static operating conditions of level shifter circuit 20.

However, when the input signal at input IN is a logical "0" and the control signal at node y is also at a logical "0," then transistor 24 is turned on while both transistors 23 and 25 are turned off. On the other hand, when the input signal at input IN is at a logical "1," and the control signal at node y is also at a logical "1," then transistor 24 is turned off while both transistors 23 and 25 are turned on. The above-mentioned two states represent the special operating conditions of level shifter circuit 20, which removes the strong "fight state" between transistors 24 and 25 during write. In turn, the switching threshold of level shifter circuit 20 can be lowered to approximately 0.8 V.

As has been described, the present invention provides a level shifter circuit having a lower switching voltage threshold than the prior art level shifter circuits. The pull-up control logic block of the present invention is implemented via a state table approach. The switching threshold of the level shifter can be further reduced by using low-threshold (V) devices for transistors 25 and 26.

While the invention has been particularly shown and described with reference to a preferred embodiment, it will be understood by those skilled in the art that various changes in form and detail may be made therein without departing from the spirit and scope of the invention.

What is claimed is:

1. An apparatus comprising:
 a level shifter core circuit; and
 a pull-up control logic circuit, coupled to said level shifter core circuit, for selectively turning on a keeper transistor within said level shifter core circuit, in response to an output signal of said level shifter core circuit and an input to said level shifter core circuit, to prevent strong P-N fight state, wherein said pull-up control logic circuit includes two pull-up transistors, a pull-down transistor, and an NOR function circuit.

2. The apparatus of claim 1, wherein said pull-up control logic circuit further includes a plurality of inverters.

3. The apparatus of claim 1, wherein said two pull-up transistors are p-channel transistors.

4. The apparatus of claim 1, wherein said pull-down transistor is connected to ground.

5. The apparatus of claim 1, wherein said pull-down transistor is a low-threshold device.

6. The apparatus of claim 1, wherein said two pull-up transistors within said pull-up control logic circuit allows said level shifter core circuit to be set in a deterministic state during power-up by turning off said keeper transistor within said level shift core circuit to remove any floating node condition at an output of said pull-up control logic circuit.

7. The apparatus of claim 1, wherein said pull-up control logic circuit outputs a control signal to turn said keeper transistor within said level shift core circuit either on or off.

8. The apparatus of claim 1, wherein said first power supply provides a higher voltage than said second power supply.

9. The apparatus of claim 1, wherein said level shifter core circuit and said two pull-up transistors are connected to a first power supply, and said NOR function circuit is connected to a second power supply.

* * * * *